United States Patent [19]

Kojima et al.

[11] Patent Number: 4,958,215
[45] Date of Patent: Sep. 18, 1990

[54] PRESS-CONTACT FLAT TYPE SEMICONDUCTOR DEVICE

[75] Inventors: Shinjiro Kojima, Chigasaki; Hideo Matsuda; Masami Iwasaki, both of Yokohama; Yoshinari Uetake, Sagamihara, all of Japan

[73] Assignee: Kabushiki Kaisha Toshiba, Kawasaki, Japan

[21] Appl. No.: 384,801

[22] Filed: Jul. 25, 1989

[30] Foreign Application Priority Data

Aug. 9, 1988 [JP] Japan ................................ 63-198558

[51] Int. Cl.$^5$ ...................... H01L 23/42; H01L 23/44; H01L 23/46; H01L 23/48
[52] U.S. Cl. ........................................ 357/79; 357/68; 357/71; 357/74
[58] Field of Search ...................... 357/68, 79, 71, 74; 437/216, 222

[56] References Cited

U.S. PATENT DOCUMENTS

| | | | |
|---|---|---|---|
| 3,581,160 | 5/1971 | Piccone et al. | 357/79 |
| 4,383,355 | 5/1983 | Eisele | 29/588 |
| 4,402,004 | 8/1983 | Iwasaki | 357/79 |
| 4,426,659 | 1/1984 | de Bruyne et al. | 357/74 |
| 4,587,550 | 5/1986 | Matsuda | 357/79 |
| 4,694,322 | 9/1987 | Sakurai et al. | 357/74 |
| 4,712,128 | 12/1987 | Bennett | 357/79 |

*Primary Examiner*—Rolf Hille
*Assistant Examiner*—David Ostrowski

*Attorney, Agent, or Firm*—Finnegan, Henderson, Farabow, Garrett and Dunner

[57] ABSTRACT

A press-contact flat type semiconductor device is disclosed which, without alloy-bonding a silicon pellet to a molybdenum or tungsten disc, assures a uniform press contact because a warp on the silicon pellet is largely reduced in comparison with a conventional device. A silver sheet is omitted between an anode electrode post and the silicon pellet to absorb a warp on the pellet. It is only necessary to insert a molybdenum or tungsten disc there, instead, which is thinner than a counterpart of the conventional device. Between the cathode electrode of the silicon pellet and a cathode electrode post use is made of, in the place of a conventional molybdenum foil and silver cap, an annealed soft copper cap of better malleability and, in the place of conventional molybdenum disc, an inexpensive hard copper sheet of adequate thickness and rigidity, not annealed, which can assure uniform press contact with the cathode electrode surface which oppositely confronts a gate lead connection circuit of a cathode electrode post. Since the silicon pellet is not alloy-bonded to the molybdenum or tungsten disc, it is simple and easy to form a bevelled structure, and to perform a silicone insulating rubber coating operation, so as to obtain the anode-to-cathode withstand voltage of the silicon pellet. Thus an inexpensive press-contact flat type semiconductor device of a long life can be provided which ensures more uniform press contact than a conventional semiconductor device.

1 Claim, 3 Drawing Sheets

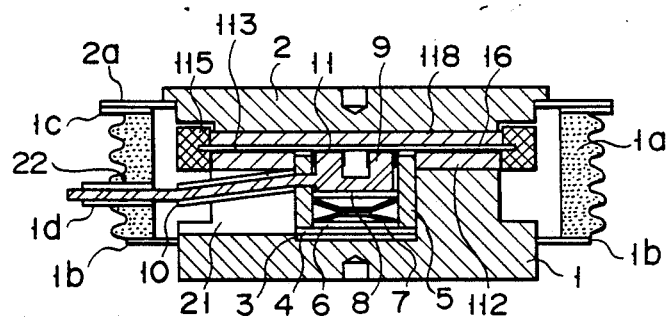
F I G. 3
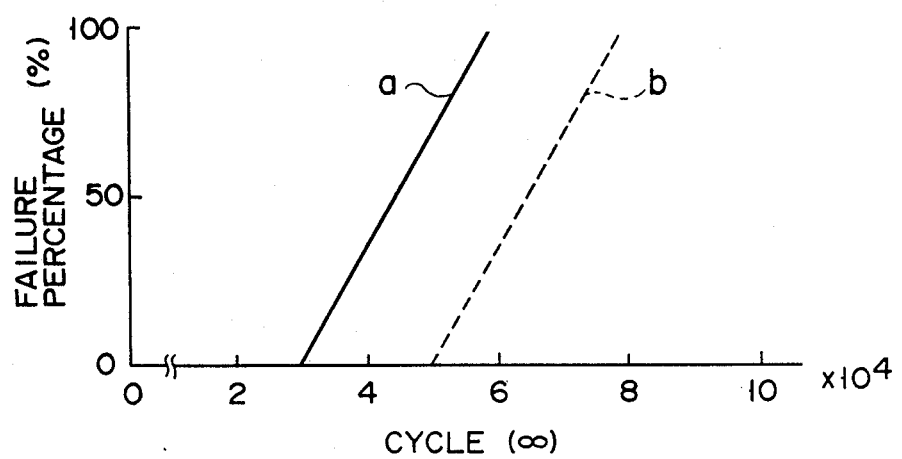
F I G. 4

PRESS-CONTACT FLAT TYPE SEMICONDUCTOR DEVICE

BACKGROUND OF THE INVENTION

1. Field of the Invention

The present invention relates to a press-contact flat type semiconductor device, such as a center gate type thyristor.

2. Description of the Related Art

A press-contact flat type semiconductor device has increasingly been employed to control large power supply to various associated industries, such as vehicle industries, iron mills and welding machine industries. Of this type of semiconductor device, a GTO (gate turn-off thyristor) belonging to a center gate type thyristor will be explained below as being a conventional example.

FIG. 1 is a cross-sectional view showing a GTO of a conventional alloy junction type. In FIG. 1, respective component parts are shown separated away in a press direction for ease in viewing. A package comprises a bottom structure 1 and a top structure 2.

A copper cathode electrode post 1 is silver-brazed by a metal ring sheet (hereinafter referred to a ring) 1b to the bottom surface of an insulating (ceramics) cylinder 1a. A weld ring metal sheet (hereinafter referred to as a welding) 1c is silver-brazed to the top face of the ceramics cylinder 1a. A gate electrode connection gate pipe 1d is silver-brazed to the side surface of the ceramics cylinder 1a. The bottom structure 1 comprises the aforementioned members as identified by reference numerals 1 and 1a to 1d. The top structure 2 comprises an anode electrode post 2 made of copper and a weld ring 2a which is silver-brazed to the anode electrode post 2. Members as identified by reference numerals 3 to 20 are sealed within the package. The sealing is performed by welding together the weld rings 1c and 2a and completed by inserting a lead wire of a gate lead 9 through a gate pipe 1d and performing a welding with a $N_2$ gas sealed in an inner space.

An anode electrode, not shown, is provided on that major surface (an upper surface) of a silicon pellet 16 in the GTO device which is located on the anode electrode post side. A cathode electrode and gate electrode are formed on that major surface (lower surface in FIG. 1) of the pellet 16 which is located on the cathode electrode post. The anode electrode on the upper surface of the silicon pellet 16 is initially alloy-bonded to a W disc (tungsten disc) 18 by means of an Al-Si sheet (brazing material) 17. A Si-pellet/W-disc bond unit may produce a warp caused by a difference in thermal expansion coefficient between the silicon and the tungsten and hence produce a defect upon the press contact of the associated components. For this reason, a sheet 19 of a soft metal, such as Ag, is sandwiched between the anode electrode post 2 and the tungsten disc 18 and silver caps 13 and 11 are located between the cathode electrode post 1 and cathode and gate electrodes of the silicon pellet 16. This arrangement assures a better press contact of these associated components.

A molybdenum foil 14 is disposed between the silver cap 13 and the aluminum cathode electrode on the silicon pellet 16 to prevent the silver cap from being attached to the cathode electrode. A cutout 21 is provided in the cathode electrode post 1 to allow the gate lead 9 to be taken out therethrough. The use of a somewhat thick molybdenum disc 12 ensures the uniform press contact of the silver cap 13 over the whole surface of the cap. Silicon rubber members 15 and 20 are employed to electrically insulate the anode electrode side of the silicon pellet 16 from the cathode electrode side of the silicon pellet 16. A steel sheet (1.5t) 6 electrically insulated by a mica 4, Teflon ring 5 and Teflon tube 10 from the cathode electrode post, a pair of disc springs 7, Mo sheet (0.3t) 8, gate lead 9 and Ag cap 11 are provided between the gate electrode situated at the central portion of the silicon pellet 16 and the cathode electrode post 1. The cathode electrode post 1 allows the Ag cap 11 to be pressed by the aforementioned associated members against the gate electrode of the silicon pellet 16 with a steel sheet 3 inserted as shown in FIG. 1.

The GTO device are used with the anode electrode post and cathode electrode post pressed against each other by external pressure applying means, not shown, in a face-to-face direction.

The aforementioned GTO device has drawbacks (a) to (e) as will be set forth below.

(a) The silicon pellet 16 is alloy-bonded to the tungsten disc 18 with the use of the Al-Si sheet 17, producing a warp on the bond unit. In order to obtain more uniform press contact at the time of press contact, the silver caps 11 and 13 and silver sheet 19, made of a expensive metal of silver, have to be used in the positions shown in FIG. 1.

(b) Since the silver pellet 16 and tungsten disc 18 are alloy-bonded to each other, more assembling steps are required than otherwise.

(c) It is necessary to employ the silver cap 13 as set forth below so as to avoid a possible warp at a bond unit between the silver pellet 16 and the tungsten disc 18. In this case, in order to prevent the cathode electrode (aluminum electrode) from being attached to the silver cap 13, it is necessary to insert the molybdenum foil 14 therebetween.

(d) A greater number of components has to be inserted between the anode electrode post 2 and the cathode electrode post 1 and most of them are expensive, such as members 12 to 19 in FIG. 1.

(e) The silicon rubbers 15 and 20, an insulating material for electrically insulating the anode side surface from the cathode side surface of the silicon pellet, are complex in configuration and numerous in number.

SUMMARY OF THE INVENTION

It is accordingly the object of the present invention to provide a press-contact flat type semiconductor device which can solve the aforementioned problems caused by a warp on a silicon pellet and assure a uniform press contact and can obtain an improved productivity over a prolonged period of time at a lower cost than a conventional semiconductor device.

According to the present invention, there is provided a press-contact flat type semiconductor device including a control electrode-equipped silicon rectifier element (hereinafter referred to as a silicon pellet) which is sealed within a package having a hollow insulating cylinder equipped with gate electrode connection section at its side wall and cathode and anode electrode posts which oppositely face each other with the hollow insulating cylinder sandwiched therebetween, in which a metal sheet of molybdenum (Mo) or tungsten (W) is located between the anode electrode post and an anode electrode on the silicon pellet and a soft copper thin sheet and hard copper sheet are located between the cathode electrode on the silicon pellet and the cathode electrode post in that order in a direction downward from the pellet, and the metal sheet (Mo or W) and soft and hard copper sheets have their major surfaces brought into contact with each other without being alloy-bonded to each other and are placed in a press-contact state between the anode and cathode electrode posts.

Thus the press-contact flat type semiconductor device of the present invention can solve the aforementioned problems as caused by a warp on the silicon pellet and assure a uniform press fit and can improve a productivity over that of the aforementioned conventional device and assure a prolonged life of the device as well as a lower cost.

BRIEF DESCRIPTION OF THE DRAWINGS

FIG. 3 is a cross-sectional view showing the GTO device of FIG. 2 in a press-contact state; and FIG. 4 is a graph showing a relation of a failure percentage to a cycle at a test conducted.

DETAILED DESCRIPTION OF THE PREFERRED EMBODIMENTS

A GTO device according to an embodiment of the present invention will be explained below by referring to FIGS. 2 to 4.

Figure 1:
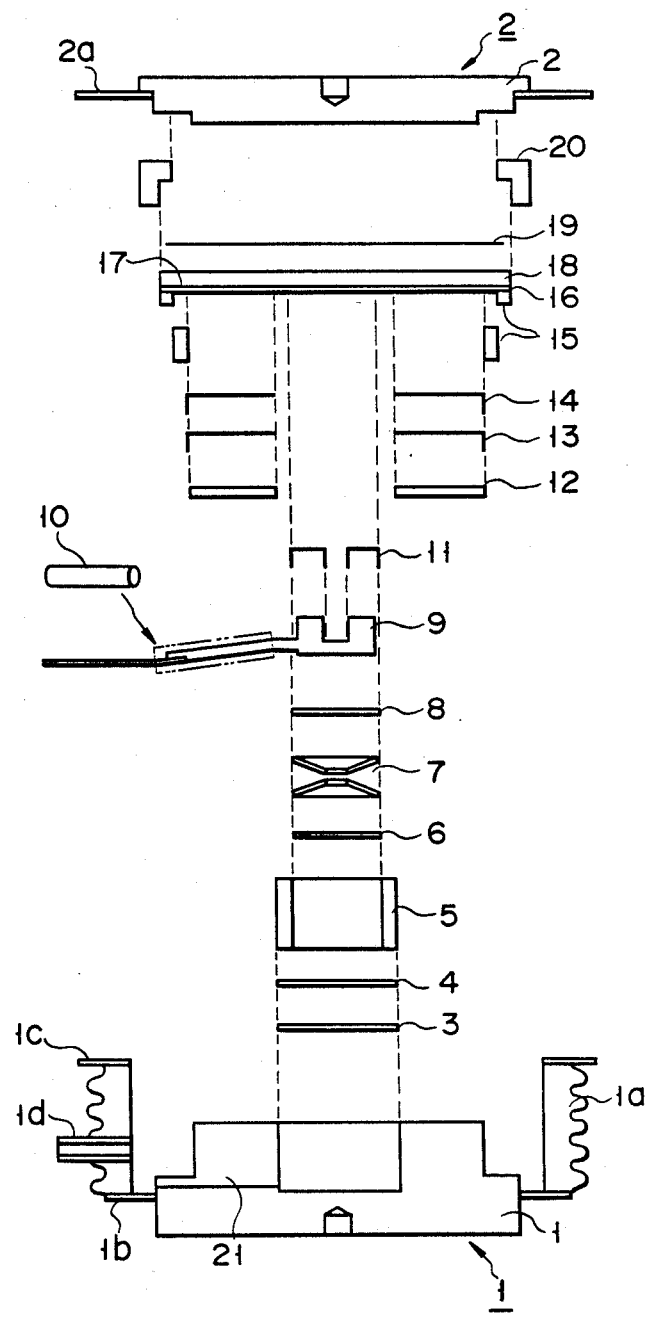
FIG. 1 is a side view showing a conventional GTO device with their components disassembled.
Figure 2:
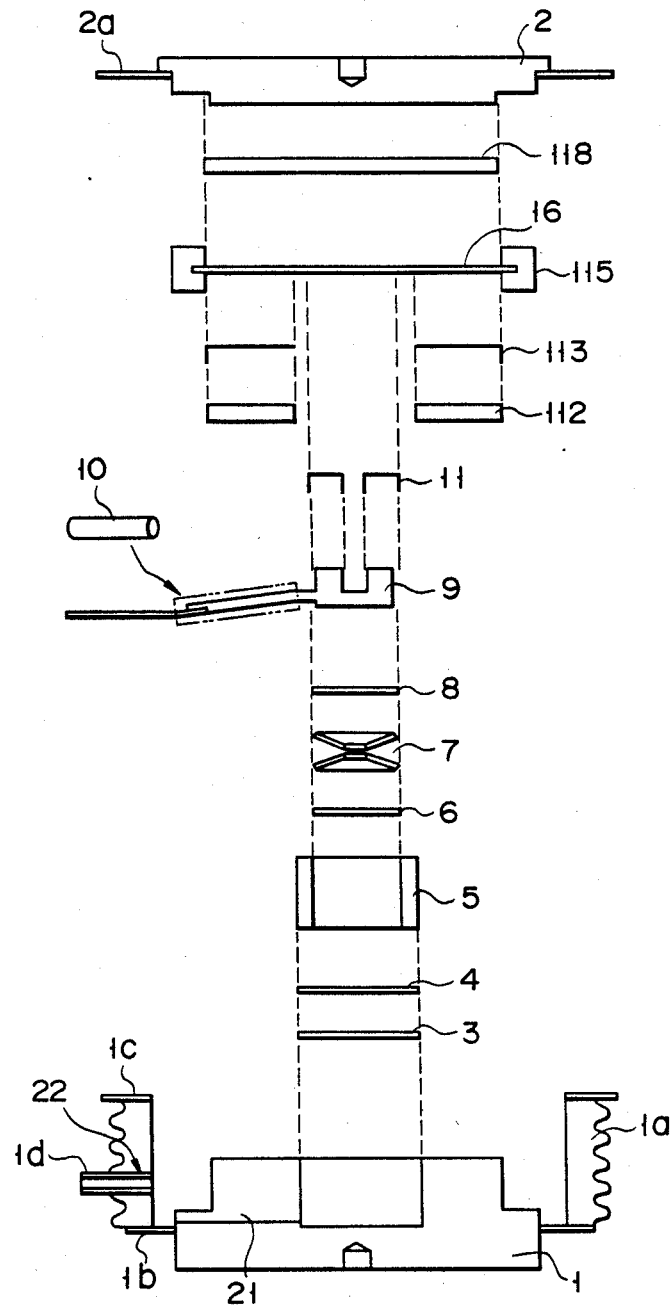
FIG. 2 is a side view showing a GTO device of the present invention with their components disassembled.

FIGS. 2 and 3 are a model showing a GTO device of the present invention, FIG. 2 showing respective components separated away in the press-contact direction for ease in observation and FIG. 3 showing the GTO device with their components in press-contact state. In FIGS. 2 and 3, the same reference numerals are employed to designate parts or components corresponding to those shown in FIG. 1, noting that their dimensions do not always correspond to those of FIG. 1.

A gate electrode connection section 22 which is located on the side of an insulating (ceramics) cylinder 1a is a connection gate pipe 1d which is silver-brazed to the side of the cylinder 1a.

The GTO device of the present invention is particularly different from the conventional GTO device in that, in place of the tungsten disc 18 alloy-bonded by the silver sheet 19 and Al-Si sheet 17 to the pellet 17, a molybdenum disc (1t×φ48) 118 is inserted between an anode electrode post 2 and a silicon pellet 16 and, unlike the conventional GTO device, is not of a alloy-bonded type; that, in place of the molybdenum foil 14, silver cap 13 and molybdenum disc 12, a soft copper thin sheet (Cu cap, 0.1t×φ, 48) 113 and soft copper sheet (3t×φ48) 112 are inserted between a cathode electrode of the silicon pellet 16 and the cathode electrode post 1; and that a silicone rubber member 115 is employed in place of the silicon rubber members 15 and 20 for insulating the anode and cathode sides of the silicon pellet 16 from each other.

These components will be explained below in more detail.

The molybdenum disc 118 is a metal sheet which is used as an insert for assuring a uniform press relative to the anode electrode post 2 and anode electrode surface of the silicon pellet 16. In this case, tungsten is sometimes used for the disc 118 in place of molybdenum. For this reason, the molybdenum disc is ground to provide a flatness of below 20 μm and a parallelism of below 10 μm with a surface roughness of below 2 to 3 μm.

The silicon pellet 16 has an anode electrode of aluminum on one major surface and a gate electrode of aluminum at a central area on the other major surface with a mesa type Al cathode electrode provided, as a greater number of island segments, around the gate electrode and toward an outer periphery of the pellet. A groove of a double bevelled structure is provided in an outer wall of the pellet so as to maintain a withstand voltage across the anode electrode side and the cathode electrode side.

The silicone rubber member 115 embrances the groove so as to maintain a creeping withstand voltage across the anode and cathode electrodes. The silicone rubber 115 is shaped by pouring a liquid silicon resin into a mold and curing it at 200° C.

In order to achieve uniform contact between the mesa type Al cathode electrode of the silicon pellet 16 and the copper sheet 112, the copper cap (soft copper sheet) of 0.1 mm thick is obtained by annealing a copper sheet at 500° C. for one hour and bending it at the outer peripheral portion to provide a cap-like configuration. A gate lead hole is formed at the center of the copper cap. The copper cap has, in particular, a surface roughness of below 0.2 μm with a thickness variation of below 5 μm.

The copper disc (hard copper plate) 112 is of a doughnut-like type with a center hole through which a gate lead 9 is inserted. The copper disc 112 is sandwiched between the copper cap 113 and the cathode electrode post. A cutout 21 for taking out a gate lead 9 is provided in that portion of the cathode electrode post which is located on the side of the pellet. For this reason, no direct press force acts upon the copper cap 113 which faces the cutout 21. The copper disc 112 is about 3 mm thick and hence has a rigidity which gives as uniform a press as possible to the copper cap portion over which no direct press is exerted. The copper disc 112 is a "rolled" copper sheet with a surface roughness of 0.2 to 0.3 μm which is readily obtained. In this connection, it is noted that the copper disc 112 is not annealed.

The molybdenum disc 118 is placed on the anode post side of the silicon pellet 16 and has a high rigidity and a thermal expansion coefficient near that of silicon. The anode electrode of the silicon pellet 16 is aligned with the anode electrode post 2 with the disc (flat sheet or surface sheet) 118 placed therebetween. The cathode electrode post 1 is aligned with the cathode electrode side surface of the silicon pellet 16 with an annealed soft copper thin sheet 113 of high malleability and hard copper sheet 112 of proper rigidity interposed therebetween. By so doing, uniform press contact is made relative to the anode and cathode electrodes of the silicon pellet 16.

Tests were made on the combinations of electrode materials to be placed between the anode electrode post (hereinafter referred to the anode side) and the silicon pellet and between the silicon pellet and the cathode electrode post (hereinafter referred to the cathode side). By selecting the kinds of such electrode materials and their combinations, the silicon pellets were examined for breakage under a varying contact pressure of 2, 4, 6 and 8 tons when the silicon pellet was φ60. Temperature cycle tests (TCT) were also conducted for a breakage of the silicon pellet and for a liability of the silicon pellet to be attached to the Al electrode. The thermal resistances were also examined for comparison.

The results of these tests are shown in Table 1 by way of example.

TABLE 1

| anode side | cathode side | | | |
|---|---|---|---|---|
| | Al 0.5t | Cu 0.5t | Mo 0.4 or 1t | Fe 1t |
| Al 0.5t | x | | | |
| Cu 0.5t | | x | | |
| Mo 1t | Δ | Δ | Δ | |
| Fe 1t | x | | o* | o* |

| anode side | cathode side Cu . disc 3t | | | |
|---|---|---|---|---|
| | Mo 0.05t | Ag 0.1t | annealed Cu 0.1t | annealed Cu 0.5t |
| Al 0.5t | | | | |
| Cu 0.5t | | | | |
| Mo 1t | o | Δ | o | o |
| Fe 1t | x | x | x | x | x: Si pellet broken
Δ: Si pellet not broken, but attached to Al electrode
o: Si pellet not broken, but not attached to Al electrode
*: greater thermal resistance The left column of Table 1 shows the materials used and thickness of metal sheets (corres. to molybdenum disc 118) placed on the anode side. That is, 4 kinds of metal sheets are shown in the left column: Al (0.5t), Cu (0.5t), Mo (1.0t) and Fe (1.0t). The top row shows 4 metal sheets and 4 combinations of metal sheets in total of 8 kinds, that is, each one-metal sheet case (4 kinds) placed on the cathode side and each two-metal sheet case (4 kinds): four combinations with a Cu disc (3t) of Mo (0.5t), Ag (0.1t), annealed Cu (0.1t) and annealed Cu (0.5t) foil. In this case, temperature cycle tests (TCT) were conducted, under a pressure of 6 tons, over 5 cycles in a temperature/hour sequence of 200° C. for 1 hour→25° C. for 1 hour→−50° C. for 1 hour→25° C. for 1 hour. In the columns of Table, a mark × represents "Si pellet broken", a mark Δ represents "Si pellet not broken, but attached to Al electrode", a mark o represents "Si pellet not broken, but not attached to Al electrode (usable)", a mark represents a greater thermal resistance and a blank represents "not tested". From this Table it will be seen that the combinations including Mo (1t) for the anode side as well as the combinations including Cu disc (3t) and Mo (0.05t), Cu disc (3t) and annealed Cu (0.1t), and Cu (3t) and annealed Cu (0.05t) for the cathode side are desirable.

For the GTO products (devices) shown in FIG. 2, temperature fatigue tests (TFT) were conducted in a temperature sequence of 25° C.→125° C.→ΔTc=100° C. From this it will be found that a short-circuiting (breakage) across the cathode and gate electrodes, a degradation of an anode-to-cathode withstand voltage, etc. do not occur at 50 kilocycles.

The temperature fatigue tests were conducted on the conventional GTO device (FIG. 1) under the same conditions as set forth above. As a result, a failure percentage was found to be nearly 0% in a range up to 30 kilocycle, beyond which the failure percentage was increased, upon a continued test, as indicated by the solid line a in FIG. 4. According to the present invention, the failure percentage was nearly 0% in a range up to 50 kilocycles. Upon further continuation of TFT, a relation of the failure percentage [%] to the cycle is estimated to be as indicated by a broken line b in FIG. 4. The GTO device of the present invention without any alloy bond has been found to have about 1.6 times as long a life as that of the conventional GTO device with the alloy bond.

The device of the present invention has the following advantages (a) to (e):

(a) Since the silicon pellet is not alloy-bonded to the tungsten disc or the molybdenum disc, a warp on the silicon pellet is largely decreased to about 15 μm compared with, for example, about 50 μm for a conventional case. Furthermore, the rigidity of the silicon pellet is also decreased upon comparison with that of the silicon pellet involving the alloy bond. It is thus possible to enhance an accuracy of flatness of the silicon pellet at a time of press contact and to assure uniform press contact.

(b) Since no alloy bond is utilized according to the present invention, various operations become easier, such as the formation and treatment of a groove of a double beveled structure for obtaining the anode-to-cathode withstand voltage, particularly an etching operation subsequent to a grooving step and a silicone rubber coating operation.

(c) Since no alloy bond is utilized according to the present invention, a warp on the silicon pellet is reduced, reducing the number of components to be inserted between the anode electrode post and the cathode electrode post. It is thus possible to fabricate devices at low cost.

(d) It is easier to fabricate devices, because the number of components required is decreased for a reason set forth in section (c) above.

(e) The reduced warp of the silicon pallet as well as the proper selection of the electrodes assures a product life about 1.6 times as long as that of the conventional product as will be seen from the result of the TFT shown in FIG. 4.

Although, in the present embodiment, the molybdenum disc has been employed, substantially the same operation and performance can be obtained even if a tungsten disc is employed. The copper disc may be Ni-plated for rust prevention. In place of the copper disc, use may be made of a molybdenum disc or tungsten disc corresponding in rigidity to the copper disc.

Although the present invention exhibits marked advantages when being applied particularly to the GTO device, it may also be applied to the other press contact flat type semiconductor devices including no alloy bond of the silicon to the molybdenum disc or to the tungsten disc.

What is claimed is:

1. A press contact flat-type semiconductor device including an anode electrode post, a cathode post and a hollow insulating cylinder sandwiched therebetween, the semiconductor device comprising:

a gate electrode connection section provided on a side of the hollow insulating cylinder;

a disc disposed between the cathode electrode post and the anode electrode post, the disc comprising a metal selected from the group consisting of molybdenum and tungsten;

a pellet disposed between the disc and the cathode electrode post, the pellet including an anode electrode and a cathode electrode located on the anode electrode post and the cathode electrode post, respectively, and a gate electrode disposed on a central portion of the pellet;

a first, relatively thin metal sheet comprising soft copper disposed between the pellet and the cathode electrode post;

a second metal sheet comprising hard copper disposed between the first metal sheet and the cathode electrode post, wherein the anode electrode post, the metal disc, the pellet, the first metal sheet, the second metal sheet and the cathode electrode post are disposed in pressing contact with each other without the respective surfaces thereof being joined;

a gate lead disposed between the cathode electrode post and the gate electrode of the pellet, the gate lead being electrically insluated from the cathode electrode post; and an elastic body disposed between the cathode electrode post and the gate electrode of the pellet, the gate lead and the elastic body being disposed in pressing contact with each other.

* * * * *